United States Patent
Ibrahim et al.

[11] Patent Number: 5,808,895
[45] Date of Patent: Sep. 15, 1998

[54] METHOD AND APPARATUS FOR LOW SIGNAL TO NOISE RATIO INSTANTANEOUS PHASE MEASUREMENT

[75] Inventors: Khalid M. Ibrahim, San Jose; William D. Bachalo, Los Altos Hills, both of Calif.

[73] Assignee: Aerometrics, Inc., Sunnyvale, Calif.

[21] Appl. No.: 655,831

[22] Filed: May 31, 1996

[51] Int. Cl.$^6$ ...................................................... G01R 25/00
[52] U.S. Cl. ........................ 364/484; 364/484; 364/485; 324/76.47; 324/76.77; 324/76.82
[58] Field of Search .................................. 364/484, 485, 364/487, 574, 576; 324/76.12, 76.19, 76.21, 76.22, 76.24, 76.41, 76.42, 76.47, 76.82, 76.64, 76.55, 76.15, 76.62, 76.48

[56] References Cited

U.S. PATENT DOCUMENTS

| | | | |
|---|---|---|---|
| 4,533,873 | 8/1985 | Alcock | 327/236 |
| 4,700,129 | 10/1987 | Yoshizawa et al. | 324/74 |
| 4,944,036 | 7/1990 | Hyatt | 364/724.04 |
| 5,001,724 | 3/1991 | Birgenbeier et al. | 375/226 |
| 5,019,786 | 5/1991 | Fairley et al. | 324/76.41 |
| 5,179,344 | 1/1993 | Najle et al. | 324/613 |
| 5,187,719 | 2/1993 | Birgenheier et al. | 375/226 |
| 5,272,447 | 12/1993 | Furuya et al. | 375/324 |
| 5,337,014 | 8/1994 | Najle et al. | 324/613 |
| 5,359,332 | 10/1994 | Allison et al. | 342/457 |
| 5,367,538 | 11/1994 | LaRosa et al. | 375/328 |
| 5,432,826 | 7/1995 | Rieder | 375/371 |
| 5,503,159 | 4/1996 | Burton | 128/703 |

*Primary Examiner*—James P. Trammell
*Assistant Examiner*—Cuong H. Nguyen
*Attorney, Agent, or Firm*—Blakely Sokoloff Taylor & Zafman, LLP

[57] ABSTRACT

The system and method of the present invention generates high resolution phase measurements without the high processing and memory overhead requirements found in prior art circuits and methods. Each signal sample (of N samples) is divided further into J segments each segment having K samples. The frequency is computed with respect to one J segment and is used in the phase measurement computations performed for the remaining segments. The phase measurements performed with respect to each J segment are then averaged to compute a high resolution phase measurement for the corresponding N segment.

40 Claims, 8 Drawing Sheets

METHOD AND APPARATUS FOR LOW SIGNAL TO NOISE RATIO INSTANTANEOUS PHASE MEASUREMENT

BACKGROUND OF THE INVENTION

1. Field of the Invention

The present invention relates to the phase measurements. More particularly, the present invention relates to cost effective real time phase measurements in a low signal to noise ratio environment.

2. Art Background

In numerous communication, instrumentation and measurement applications, an instantaneous phase measurement is required. However, noisy signals (of Signal to Noise Ratio (SNR) less than 0 dB) are occasionally encountered. Moreover, for most of these applications, the frequency of the incoming signal is unknown and needs to be measured prior to computing the phase measurement. This follows from the fact that phase measurement algorithms require that the signal frequency be resolved to better than $$\frac{1}{T_{obs}}$$

where $T_{obs}$ is the observation time. This significantly complicates the phase measurement task. Zero crossing techniques, such as counters, and Phase Lock Loops (PLL) have been widely used for both frequency and phase measurements. Using the counter method, the phase between two signals is measured by measuring the signal period and comparing it with the time between the positive slope zero crossing of the two signals. In the PLL method, a Voltage Controlled Oscillator (VCO) is used to generate a reference signal with frequency equal to the input signal. The phase of the signal is then measured with respect to the input signal using analog or digital multipliers (AND gate) followed by averaging circuit. Unfortunately, both methods fail to work with SNR lower than 10 dB. Phase measurements can also be achieved using the Fourier analysis method. The frequency is first estimated by computing the signal spectrum and extracting the frequency at the point the signal has its maximum power. A reference sinusoidal signal is then generated. The frequency of the reference signal with respect to the reference signal is then computed by subtracting the two measurements of phase.

Using the Fourier analysis method, phase measurement accuracy is inversely proportional to the time of measurement (i.e., the time over which the signal is observed and processed) and the SNR. When sampled data is used, the variance of the phase is then given by:

$$\text{var}[\Phi] = \frac{2(2N-1)}{SNR N(N-1)}$$

where $\Phi$ represents the phase SNR represents the signal to noise ratio and N represents the number of samples.

For a specified SNR, the only way to improve the phase measurement accuracy is by increasing the number of samples N. If the signal frequency is known, then the complexity of the phase measurement algorithm will be given by $v(N)$ (i.e., the number of the computations $v$ is proportional to the number of samples). The significant increase in the algorithm complexity occurs when the frequency is unknown and it has to be estimated with an accuracy better than $f_s/N$, where $f_s$ is the sampling frequency. The FFT algorithm is one of the most efficient algorithms for this task and its complexity is given by $v*(N \log N)$. Thus, the complexity of frequency measurement algorithm is an order of magnitude greater than the complexity of the actual phase measurement algorithm. Moreover, for frequency measurement, a temporary buffer of N cells has to be allocated to store all the samples required for frequency measurement. Additional control circuitry is also needed to recall these samples for phase measurement. It should be noted that if the frequency is known, only a multiplier and an accumulator are needed to perform the task of phase measurement. In summary, the need to measure the frequency significantly increases the processing and memory requirements. The processing and memory requirements for the actual phase measurement involve only a small fraction of what is required for frequency measurement.

SUMMARY OF THE INVENTION

The system and method of the present invention generates high resolution phase measurements without the high processing and memory overhead requirements found in prior art circuits and methods. Each signal sample (of N samples) is divided further into J segments each segment having K samples. The frequency is computed with respect to one J segment and is used in the phase measurement computations performed for the remaining segments. The phase measurements performed with respect to each J segment are then combined to compute a high resolution phase measurement for the corresponding N segment.

BRIEF DESCRIPTION OF THE DRAWINGS

The objects, features and advantages of the system and method of the present invention will be apparent to one skilled in the art from the following detailed description in which.

DETAILED DESCRIPTION

In the following description, for purposes of explanation, numerous details are set forth, in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1:
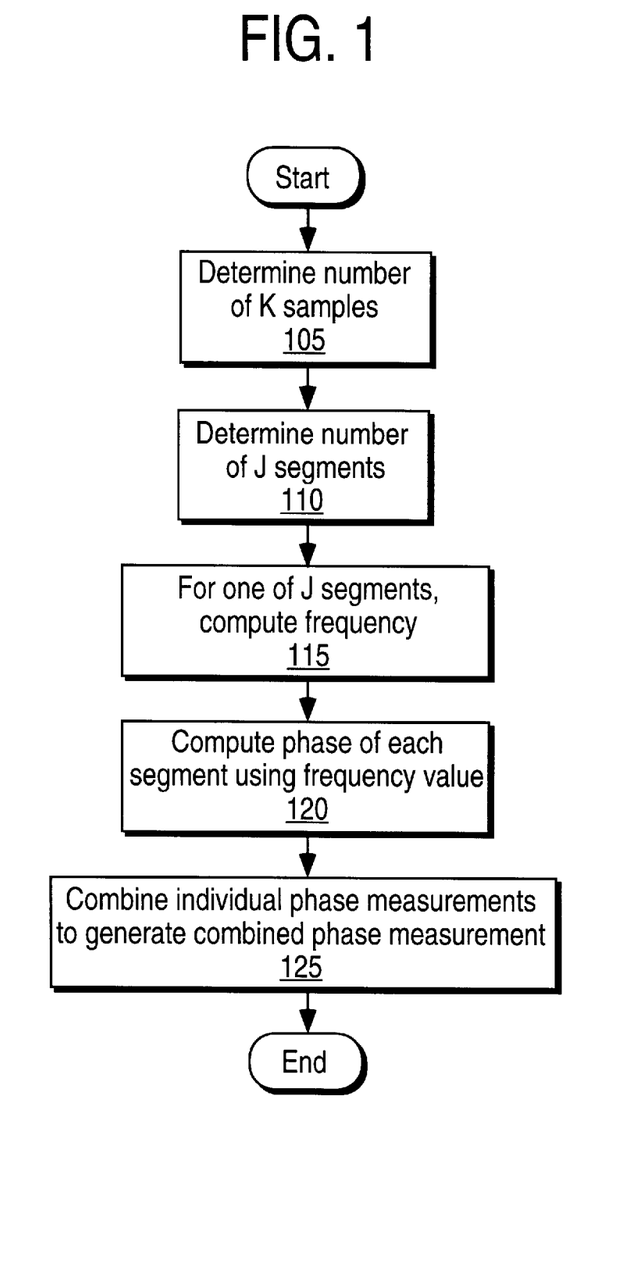
FIG. 1 is a simplified flow diagram of one embodiment of the method of the present invention.

A simplified flow diagram of the method performed to determine phase measurements in accordance with the teachings of the present invention is set forth in FIG. 1. At steps 105, 110, the signal sampled data of N samples is divided into J (to be determined) segments. Each segment comprises K samples. The number of K is chosen based on the SNR of the signal. After choosing K, J can be determined as: J=N/K (N is the total number of samples used for phase measurement, K is the number of samples for each segment).

For simplicity in implementation, it is preferred that K is chosen to be as small as possible. For example, phase measurements can be performed using a K value of 3 (i.e., using only three samples). Hardware simplicity is achieved as in such an embodiment, a corresponding hardware implementation would require only one look-up table and one accumulator. However, as the signal to noise ratio (SNR) gets lower, the rms in the phase measurement becomes larger and may cause the phase measurement to deviate more than π from its actual value. This causes a wrap around in the measurement result. In such as situation, the phase measurement is ambiguous and a large number of samples (K) should be used. Therefore, for low SNR applications, the number of samples should be chosen large enough to avoid ambiguities. Thus preferably, K is selected such that the rms in phase measurement at the minimum expected SNR is much less than π to avoid phase measurement ambiguity.

Once K is selected, J is then computed as J=N/K. Where N is the total number of samples used to perform phase measurement of the signal, K is the number of samples of each segment and is determined by the signal SNR and J is the number of segments.

As discussed above, the values of J and K are determined based upon the signal to noise ratio (SNR) of the signal. The values can be determined a variety of ways. For example, the SNR and values of K and J can be determined empirically to generate values of K and J that are programmed into the process or circuit. Alternatively, it is contemplated that the values of J and K can be determined by sampling the signal prior to initiating the process described herein and the circuit parameters set with the values of J and K determined. For example, the SNR can be measured using circuitry and methods well known to those skilled in the art and the values of K and J determined from the measured value. Alternatively, the process includes the steps of determining K and J. Likewise, the corresponding circuitry therefore includes logic to determine the values of K and J. The output of the circuitry is coupled to control the frequency measurement circuitry and phase measurement circuitry discussed below in order to provide the parameters K and J.

At step 115, the frequency is measured for the first segment. Preferably, the signal frequency is measured with an accuracy better than $f_s/K$, where $f_s$ is the sampling frequency. More particularly, the level accuracy can be determined considering the following:

Consider the signal: $s(t)=r(t)+jq(t)$ where $r(t)=A\cos(2\pi f_1 t+\phi)+n(t)$, $q(t)=A\sin(2\pi f_1 t+\phi)+\check{n}(t)$, where $f_1$ represents the signal frequency and $\phi$ represents the phase of the signal, $\check{n}(t)$ is the Hilbert transform of $n(t)$. Let $f_2$ be the frequency estimated and used for phase estimation. Using the Fourier analysis method to compute the phase of the s(t), the signal phase is given by:

$$\phi_{es} = \tan^{-1}\left\{\frac{\frac{1}{T}\int_0^T \{-r(t)\sin(2\pi f_2 t) + q(t)\cos(2\pi f_2 t)\}dt}{\frac{1}{T}\int_0^T \{r(t)\cos(2\pi f_2 t) + q(t)\sin(2\pi f_2 t)\}dt}\right\}$$

where T is the time over which the phase is measured.

With n(t)=0 (i.e., clean signals), the estimated phase ($\phi_{es}$) of the signal is given by:

$$\phi_{es}=\phi+\lambda$$

where $\phi$ is the phase of the signal and $$\lambda = \tan^{-1}\frac{\int_0^T \sin(2\pi\Delta ft)dt}{\int_0^T \cos(2\pi\Delta ft)dt}$$

and $\Delta f=f_1-f_2$ (i.e., the difference between the actual signal frequency and frequency used for phase measurement). To accurately measure the phase of the signal, $\lambda$ should be much smaller than 1. To ensure that ($\lambda<<1$), $\Delta fT$ should be much smaller than one. This can be achieved if the frequency used for phase measurement is estimated with high precision. This typically requires a highly complicated hardware if the absolute value of the signal phase is required. Fortunately, hardware can be simplified for phase difference measurement. In particular, the phase difference between two signals $s_1(t)$ and $s_2(t)$ is given by:

$$(\phi_d)_{es}=\phi_{es1}+\lambda-\phi_{es2}-\lambda=\phi_d=\text{actual phase difference.}$$

Therefore, for the measurement of the phase difference between two clean signals, there is no need to estimate the signal frequency. However, when noise is added to the signals, the estimated phase value is:

$$\phi_{es} = \tan^{-1}\left\{\frac{\tan\phi + \lambda + \nu}{1 - \lambda\tan\phi + \mu}\right\}$$

where, $$\nu = \frac{\frac{1}{T}\int_0^T (n(t)\sin 2\pi f_1 t + \check{n}(t)\sin 2\pi f_1 t)}{\frac{1}{T}\int_0^T \cos 2\pi\Delta ft\, dt}$$

and $$\mu = \frac{\frac{1}{T}\int_0^T (n(t)\cos 2\pi f_1 t + \check{n}(t)\sin 2\pi f_1 t)dt}{\frac{1}{T}\int_0^T \cos(2\pi\Delta ft)}$$

To optimize the phase measurement, $\mu$ and $\nu$ should be made as small as possible. The numerators of $\nu$ and $\mu$ are characteristics of the signal and the noise and cannot be controlled. However, the numerator is a function of $\Delta f$ (i.e., how accurate the frequency is measured). Thus, $\mu$ and $\nu$ can be minimized by maximizing the denominator. This can be achieved by keeping the denominator $\Psi$ close to its maximum value of one where, $$\Psi = \frac{1}{T} \int_0^T \cos(2\pi\Delta ft)dt = \frac{\sin(\pi\Delta fT)}{\pi\Delta fT}$$

For $T\Delta f \leq 2$, $\Psi$ is greater than or equal to 0.65 and for $T\Delta f \leq 4$, $\Psi$ is greater than or equal to 0.9. This corresponds to only a minimal loss in SNR of 1.5 and 0.4 dB, respectively. The above equations indicate that precise frequency measurement is not necessary to attain a value close to one for $\Psi$. A value of $\Delta fT=4$ means that the frequency needs to be measured with accuracy four times better than that obtained with the DTF method. This task is feasible an can be implemented in real time.

Several well known methods, such as zero crossing counting and the fast Fourier Transform (FFT) algorithm, can be used for frequency measurement with an accuracy similar or better than what is required by the above derivation. For low SNR (less than 10 dB), only the FFT algorithm provides reliable measurements. For example, the structure and method described in copending U.S. patent application Ser. No. 07/942,044 for Method and Apparatus for Improvised Digital Signal Processing using Discrete Fourier Transform, filed Sep. 8, 1992 is used. More particularly, the method for determining the frequency consists of the following steps: dividing the signal into a plurality of concurrent signals, converting each of the plurality of concurrent signals into an encoded signal by performing an analog to digital conversion, the sampling of each of the concurrent signals being done at a different sampling frequency, performing a discrete Fourier transform (DFT) on each of the encoded signals by utilizing the encoded signals to access a decoding or memory storage device, the individual memory locations of that device having stored therein the value of the DFT corresponding to the binary representation of the address of the memory location, and combining the results of the individual DFTs to determine the frequency (for example, according to a radix-r representation of number). This method offers significant reduction in the number of computations over prior art the FFT method. Using this method with the method of the current invention for computing phase measurements described herein, a relatively simple real time Fourier analysis based processor can be implemented for both frequency and phase measurements.

Once the frequency is determined for one J segment, the same frequency value is applied to computation of the phase measurement for each segment. At step 120, the phase measurement for each segment is computed. The phase measurement $\phi_i$ is determined according to the following:
If $q_i=1$ then $\phi_i=\theta$
If $q_i=2$ then $\phi_i=\pi-\theta$
If $q_i=3$ then $\phi_i=\pi+\theta$
If $q_i=4$ then $\phi_i=2\pi-\theta$
where $q_i$ represents the quadrant of the phase measurement, and $\theta$ is determined according to the following:

$$\theta = \tan^{-1}\left\{\frac{\sum_{i=0}^{K}(r(i)\cos(2\pi i k_s/K) + q(i)\sin(2\pi i k_s/K))}{\sum_{i=0}^{K}(-r(i)\sin(2\pi i k_s/K) + q(i)\cos(2\pi i k_s/K))}\right\}$$

where $k_s$ is the estimated signal frequency normalized to the sampling frequency and $0 \leq \theta < \pi/2$.

At step 125, the phase measurement values determined for each J segment are then combined to achieve the final phase measurement value $\phi$. Combining the phase measurement values is not a straightforward task because of the wrap around $2\pi$ of the phase values. The following method is devised for real time calculation of the final phase measurement value. The phase measurement values are summed to form the value $\Phi_{ACC}$. The number of phase measurements that fall into each quadrant is also determined. The final phase measurement value $\phi$ is determined to be:

If $q_1, q_2, \ldots, q_{J_{VAL}} = 1$ or 2, then $\phi = \frac{\Phi_{ACC}}{J_{VAL}}$ If $q_1, q_2, \ldots, q_{J_{VAL}} = 2$ or 3, then $\phi = \frac{\Phi_{ACC}}{J_{VAL}}$ If $q_1, q_2, \ldots, q_{J_{VAL}} = 3$ or 4, then $\phi = \frac{\Phi_{ACC}}{J_{VAL}}$ If $q_1, q_2, \ldots, q_{J_{VAL}} = 1$ or 4, then $\phi_t = \frac{\Phi_{ACC} - 2\pi q[4]}{J_{VAL}}$ ;

and
If $\phi_t \geq 0$ then $\phi = \phi_t$
If $\phi_t < 0$ then $\phi = 2\pi + \phi_t$ $J_{VAL}$ represents the number of valid segments and $q[4]$ represents the number of valid phase measurements in the fourth quadrant.

If the quadrants in which the phase measurements fall in more than two adjacent quadrants then the current phase measurement can be rejected. This can be used as an additional criterion to validate the phase measurement. This follows from that if phase measurements fall into more than two quadrants, then the measured phase varies by more than $\pi/2$ and these measurements should be rejected for accurate phase measurement results.

In the following, the computational reduction offered by this method is estimated. As said earlier, only the frequency of the one segment is computed and the number of computations is therefore minimized. In particular, the number of computations required for frequency measurement is given by $K \log K$ and the reduction in computation is given by:

$$\frac{N\log N}{K\log K} = J[1 + \log J]$$

For example, if $N=1024$ and $K=64$, then the sampled data is divided into 16 segments and the number of computations using the present invention is reduced by a factor of thirty. This reduction in computation is significant when real time processing is considered. Furthermore, for this example, the memory required is only one sixteenth of that required with the available methods. In addition, almost the same accuracy attained by the optimum scheme can be achieved with the present invention. To illustrate the above and using K samples, the number of segments can be calculated from the equation $J=N/K$. By combining J phase measurements and assuming that these measurements are independent, the phase variance is given by:

$$\text{var}[\phi] = \frac{1}{J} \frac{2(2K-1)}{SNRK(K-1)}$$

or $$\text{var}[\phi] = \frac{2(2N-J)}{SNRN(N-J)}$$

For $N \gg J$, the accuracy is almost the same as that provided by the Cramer-Rao Bound and is given by:

$$\text{var}[\phi] = \frac{2(2N-1)}{SNR(N-1)N} .$$

Figure 2:
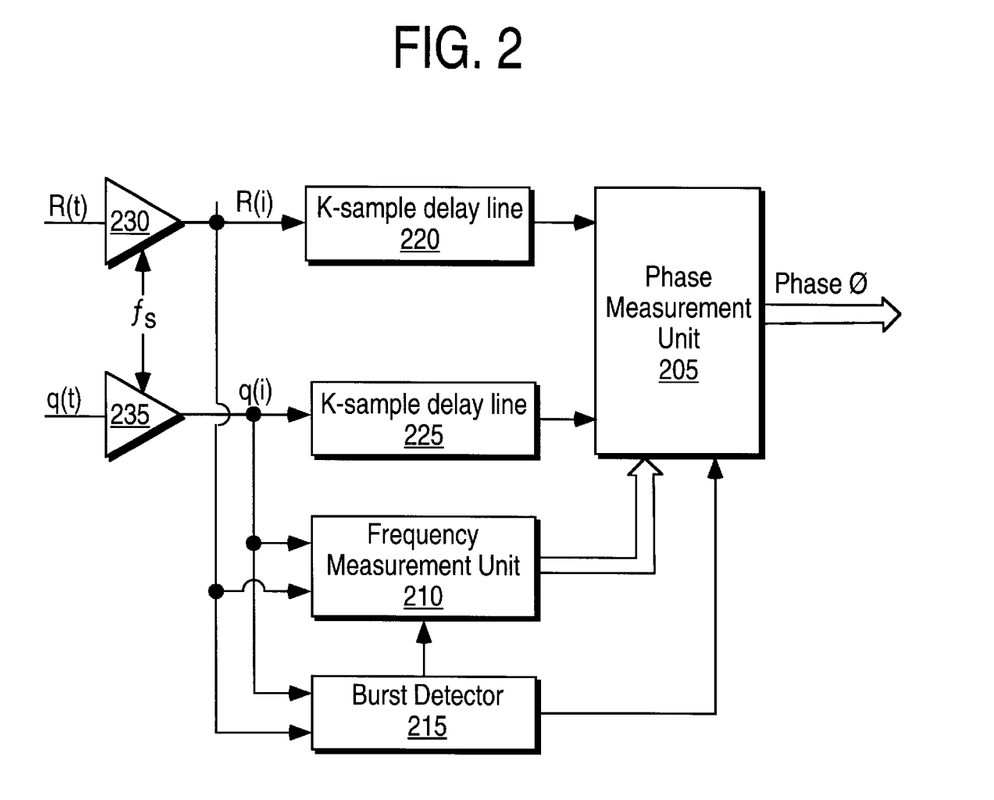
FIG. 2 is a simplified block diagram of one embodiment of the circuit of the present invention.

FIG. 2 illustrates one embodiment of the circuit of the present invention. In the present embodiment, the in-phase r(t) and quadrature q(t) signals are sampled by samplers 230, 235 at sampling frequency $f_s$ and digitized to result in sample data r(i) and q(i). The sampled data r(i) and q(i) is processed through a K sample delay line 220, 225 to offset the time delay required to measure the frequency. The delayed signals are then applied to the frequency measurement unit 210 and phase measurement unit 205. Preferably the sampled data is also input to burst detector 215. The burst detector is used in applications where burst signals are encountered. For these applications, the burst detector is used to estimate the burst length. Once the burst detector detects the presence of the signal, both the frequency and phase measurement units (210 and 205) are enabled. The phase measurement unit keeps on combining the phase measurements of the different signal segments until the burst detector detects the end of the signal. This ensures that the entire signal is processed for phase measurement and optimum measurement is attained. When the signal is continuous, the bust detector is optional. However, it can also be utilized to reject segments of the signal where the SNR is lower than a certain threshold.

The frequency measurement unit 210 computes the frequency for a single segment and is input to the phase measurement unit 205 for computation of the phase measurement values for each segment and the final output phase value.

Figure 3:
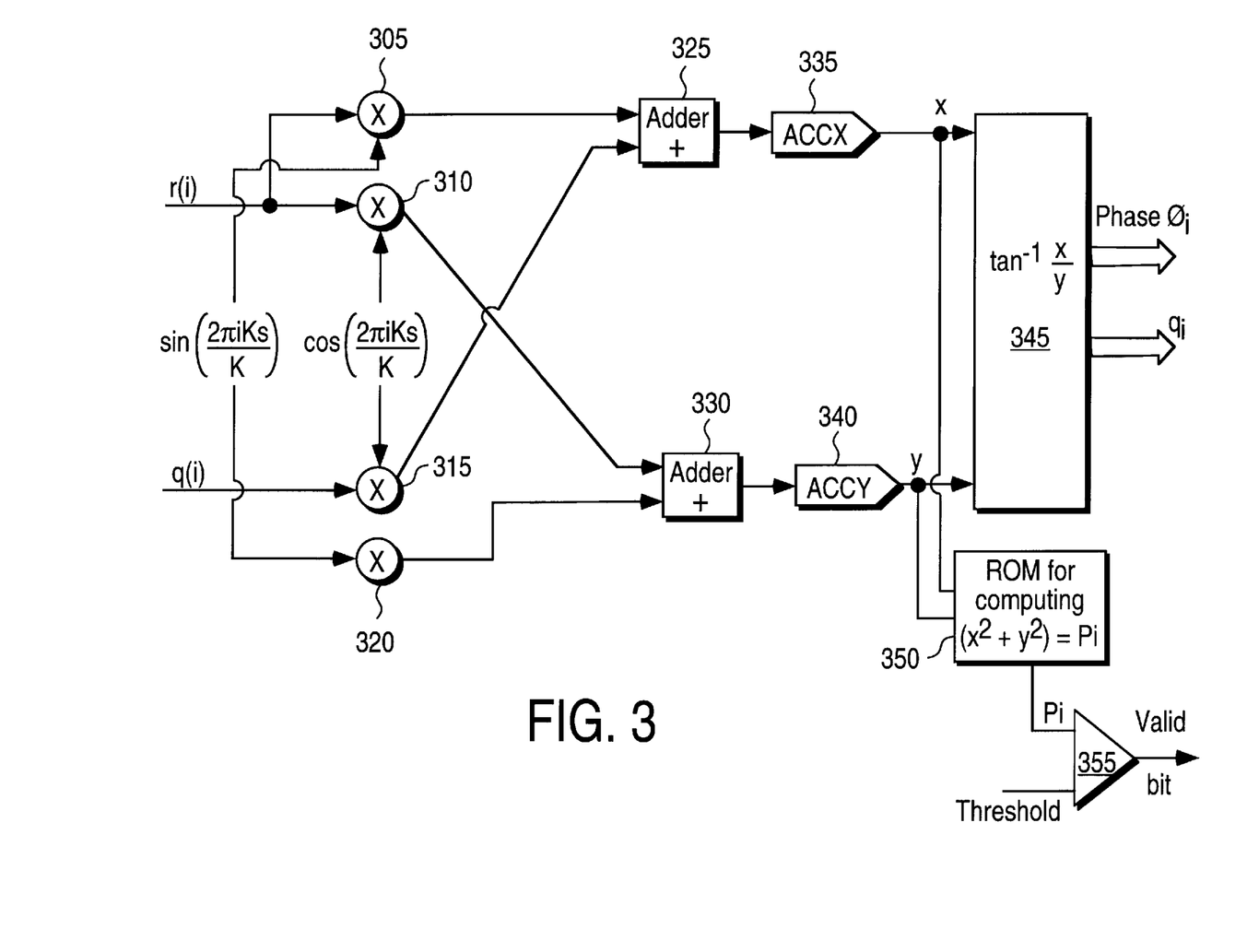
FIG. 3 is a simplified block diagram of one embodiment of a phase measurement circuit utilized to calculate the phase of each segment in accordance with the teachings of the present invention.

FIG. 3 is a block diagram of one embodiment of the portion of the phase measurement unit (205 FIG. 2) which is used to calculate the phase of each segment according to the following:
If $q_i=1$ then $\phi_i=\theta$
If $q_i=2$ then $\phi_i=\pi-\theta$
If $q_i=3$ then $\phi_i=\pi+\theta$
If $q_i=4$ then $\phi_i=2\pi-\theta$
where $$\theta = \tan^{-1} \left\{ \frac{\sum_{i=0}^{K} (-r(i)\cos(2\pi i k_s/K) + q(i)\sin(2\pi i k_s/K))}{\sum_{i=0}^{K} (r(i)\sin(2\pi i k_s/K) + q(i)\cos(2\pi i k_s/K))} \right\}$$

which corresponds to: $\tan^{-1}(x/y)$
In particular, multipliers 305, 310, 315, 320, adders, 325, 330 and accumulators ACCX 335 and ACCY 340 are used to compute the x and y values which are input to logic 345 for computation of $\tan^{-1}(x/y)$ and $q_i$. The phase $\theta = \tan^{-1} x/y$ can be measured using high speed ROMs. $q_i$ is computed based on the sign of the quantities x and y and as follows:
$q_i=1$ if $x,y \geq 0$
$q_i=2$ if $x \geq 0, y<0$
$q_i=3$ if $x<0, y \geq 0$
$q_i=4$ if $x,y<0$ The circuit also computes the signal power which is used to determine the validity of the current measurement (generates validation bit). The signal power is computed by adding the square of the outputs of the two accumulators 335, 340. This can be achieved using high speed ROM (350). The output of the ROM 350 is then used as an estimate of the signal power at the estimated signal frequency. If the power is less than a predetermined threshold, the current phase measurement is rejected. The threshold is set to an acceptable minimum detectable signal power.

Figure 4:
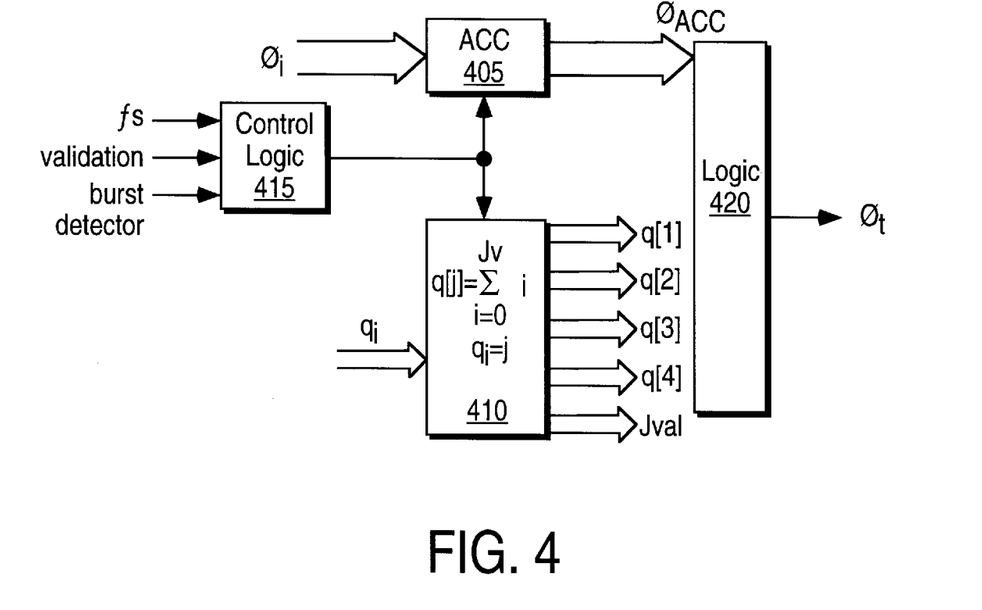
FIG. 4 is a simplified block diagram of a circuit for combining the phase measurements of the individual J segments to determine the final phase measurement value.

FIG. 4 is a simplified block diagram of one embodiment of a circuit for calculating the final phase measurement value. Each phase measurement value for each segment $\phi_i$ is input to accumulator 405. An identification of the corresponding quadrant in which the phase measurement value occurs is input to accumulator 410 which maintains a count of the number of phase measurement values occurring in each quadrant.

Control logic 415 receives as input the output of the burst detector, the validation bit and the sampling frequency used to determine the frequency value used in the phase measurement calculates. The output of the control logic is used to enable the accumulators 405 and 410 whenever the burst detector is on and the validation bit indicates the presence of a valid phase measurement.

The accumulated phase measurement value and the quadrant counts of occurrences of the phase measurement value are input to logic 420 which generates the final phase measurement value, preferably determined according to the following:

If $q_1, q_2, \ldots, q_{J_{VAL}} = 1$ or 2, then $\phi = \frac{\Phi_{ACC}}{J_{VAL}}$ If $q_1, q_2, \ldots, q_{J_{VAL}} = 2$ or 3, then $\phi = \frac{\Phi_{ACC}}{J_{VAL}}$ If $q_1, q_2, \ldots, q_{J_{VAL}} = 3$ or 4, then $\phi = \frac{\Phi_{ACC}}{J_{VAL}}$ If $q_1, q_2, \ldots, q_{J_{VAL}} = 1$ or 4, then $\phi_t = \frac{\Phi_{ACC} - 2\pi q[4]}{J_{VAL}}$ ;

and
If $\phi_t \geq 0$ then $\phi = \phi_t$
If $\phi_t < 0$ then $\phi = 2\pi + \phi_t$ FIGS. 2–4 illustrate one embodiment of the circuit of the present invention. However, applications where the sampling frequency ($f_s$) is 40 MHz or higher, multiplier-accumulators with execution time of 25 ns or less are required. These components are expensive and typically are used only for special purpose signal processing applications. In an alternate embodiment, to minimize cost, several multiplier-accumulators replace single multipliers or accumulators used and the processing is performed in parallel. The hardware complexity of this scheme is determined by the number of the multiplier-accumulators used. The number typically is equal to or higher than the multiplication of the sampling frequency by the multiplication-accumulation execution time.

Figure 5:
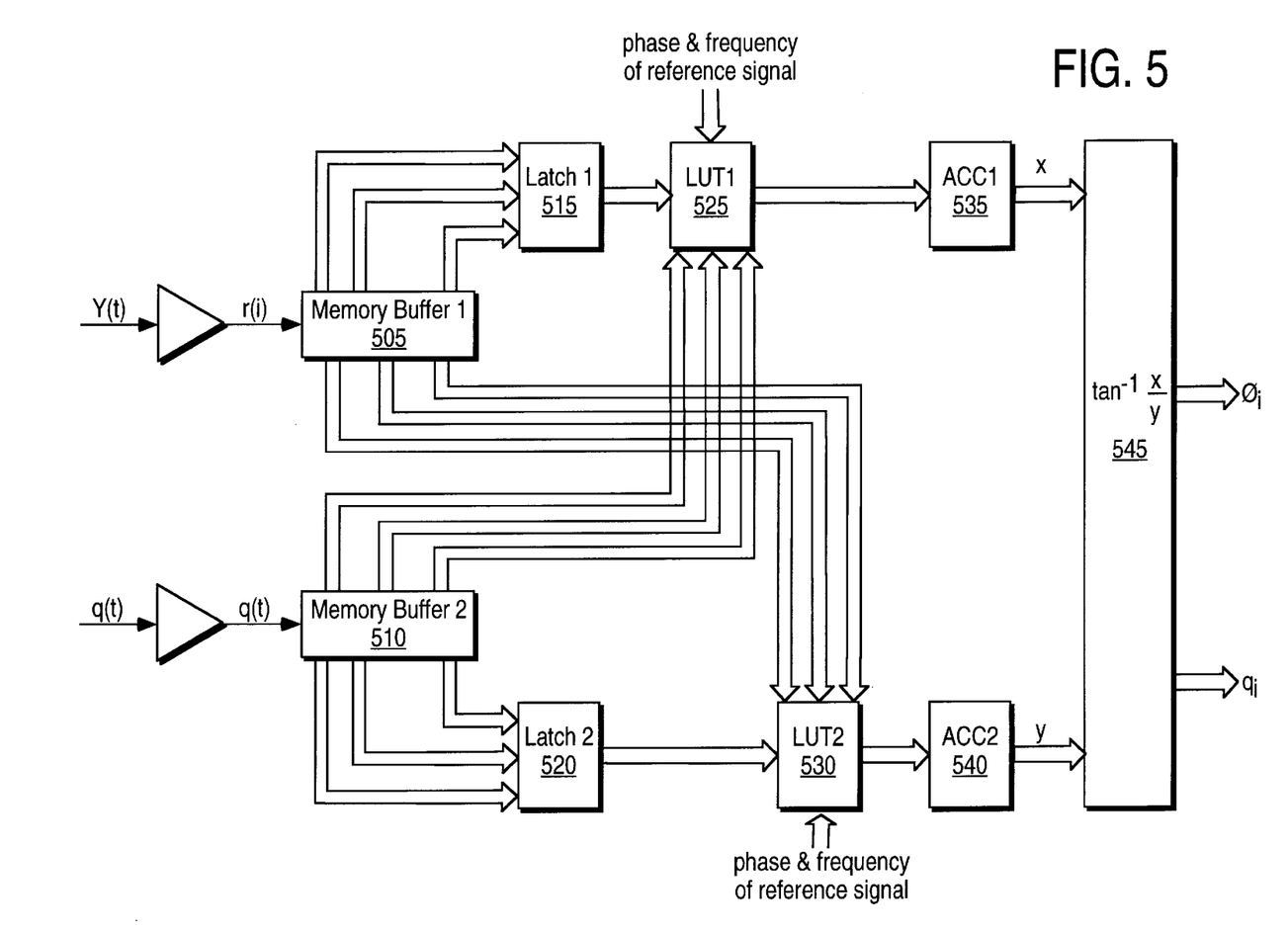
FIG. 5 is a simplified block diagram of an alternate embodiment of a phase measurement circuit utilized to calculate the phase of each segment in accordance with the teachings of the present invention.

As the sampling frequency increases, so does the number of multipliers and accumulators. At sampling frequencies higher than 120 MHz, the hardware implementation is rather intricate. For these applications, it is preferred to use an alternate embodiment illustrated by FIG. 5. FIG. 5 is a simplified schematic diagram of an embodiment which uses high speed look-up tables (LUTs) (such as high speed ROMs or RAMs). Temporary buffers 505, 510 are used to store $N_s$ a certain number of samples. This number of samples stored is chosen to be equal to or greater than the product of multiplication of the sampling frequency ($f_s$) and the look-up table access time. Each time the buffer is full, its content is latched by latches 515, 520 and used as an input to the lookup tables 525, 530. The other two inputs for the look-up tables 530, 525 are the frequency and the phase of the reference signal. Look-up tables LUT1 525 and LUT2 530 store precomputed values of the multiplication-accumulation of the several samples of the input signal with the correspondent values of the reference signals (i.e., cos ($2\pi i k_s/k$) similar to those shown in FIG. 3). Since LUTs are used for this implementation, only the integers ($i/N_s$) are used as input for the LUT to represent the phase of the reference signals. Thus, with each look-up table cycle, several multiplication-accumulation operations are performed. Because of the limitation in the number of the look-up table inputs, this approach is suitable when high speed (100 MHz and higher) low resolution analog-to-digital converters (ADCs) are used. The output of LUTs 525, 530 are input to accumulators 535, 540 which provide the input to logic 545 for computation of $\phi_i$ and $q_i$.

In the above discussion, it is assumed that the number of samples used for the frequency measurement and the phase measurement is the same. However, different numbers of samples can be used. It is essential that the frequency measurement be accurate for reliable phase measurement. Therefore, for the cases where low SNR is encountered, it may be advantageous to use a larger number of samples for frequency measurement than the number of samples used for phase measurement.

It is recognized that an ambiguity in phase measurement can occur when the sampling frequency $f_s$ is exactly equal to multiple integer L of the signal frequency. At these frequencies, the effective number of samples used for the phase measurement are reduced from K to L. This follows from the fact that the sampled data will repeat itself after L samples. Typically, the problem happens only with high SNR signals (20 dB or higher). As more noise is added to the signal, the problem becomes less noticeable. One of the strategies that is currently used to alleviate the effect of this problem is by increasing the number of samples or the sampling frequency or both. In some applications, these techniques are not effective due to the limitations posed by the signal transit time. The signal transit time is the time over which the signal is present and it is the same time over which the signal is observed and processed.

Figure 6A:
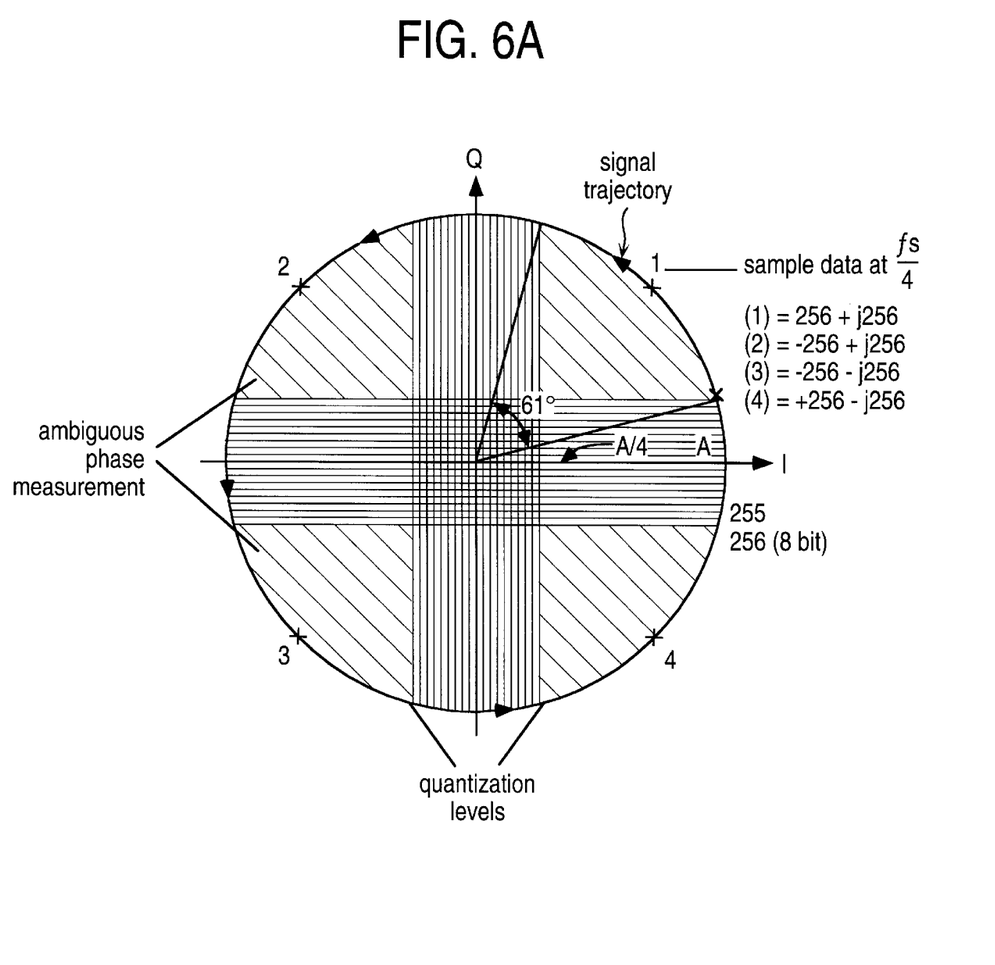
FIGS. 6a and 6b illustrate that increasing quantization levels beyond 1 bit quantization when operating in a large amplitude signal dynamic range does not result in significant improvement.
Figure 6B:
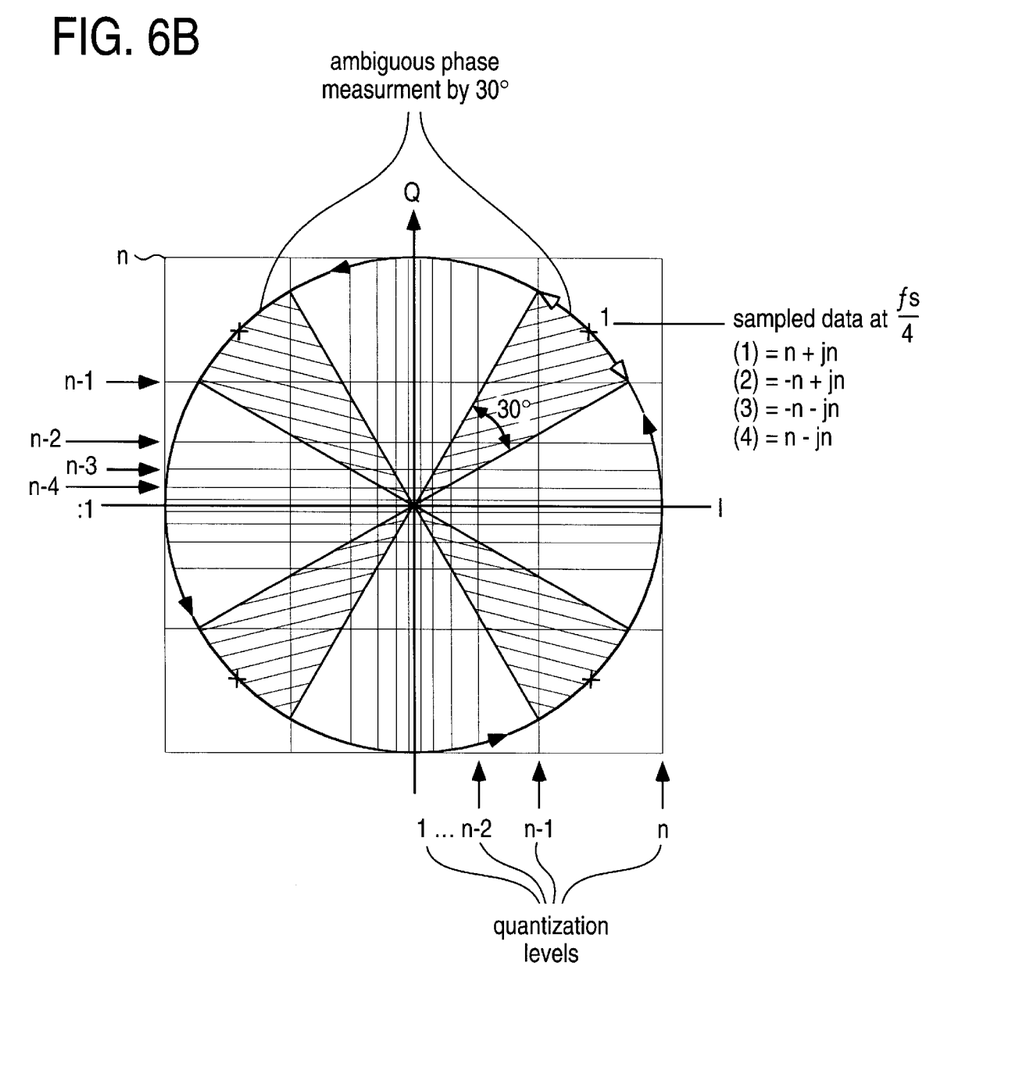

It should be noted that the above problem can be alleviated for the cases where the signal amplitude dynamic range in low by using high resolution ADCs. However, for the cases where a large amplitude signal dynamic range (>10) is encountered, increasing the number of quantization levels does not provide significant improvement over 1-bit quantization. FIGS. 6a and 6b are used to illustrate this point. FIG. 6a shows a trajectory of the signal $s(t)=i(t)+jq(t)=A$ ($\sin(2\pi t)+j \cos(2\pi ft)$) in the complex plane. For these figures, the signal dynamic range is assumed to be 1:1000 (e.g., the signal amplitude varies from 1 mV to 1000 mV) and an 8-bit ADC be used for signal quantization. To quantize small signals with reasonable resolution, each quantization level should be much smaller than 1 mV. If the quantization level is chosen to be 0.25 mV, the maximum signal that can be sampled accurately with the 8-bit ADC is 82 mV (or 8% of the input signal dynamic range). If the signal s(t) is sampled at $f_s/4$, then it can be easily shown that the ambiguity in phase measurement can be as large as 90−2 $\sin^{-1} 0.25 = 61°$. This example demonstrates that using high resolution ADCs does not offer significant improvement over the much simpler implementation using 1-bit ADC. One may argue that this problem can be resolved by using a higher resolution (more than 8-bit) ADC. However, such ADCs are expensive and they are not available to cover signal bandwidths over 20 MHz. Another argument is to spread the quantization levels in the previous example to cover the signal dynamic range more efficiently. While this significantly complicates the implementation, it does not provide significant improvement. FIG. 6b shows a logarithmic scale for the quantization levels that is used to compress signals with high amplitudes and to stretch signals with low amplitudes. With this configuration, it can be shown that the phase ambiguity at $f_s/4$ can be as large as 30°.

Figure 7:
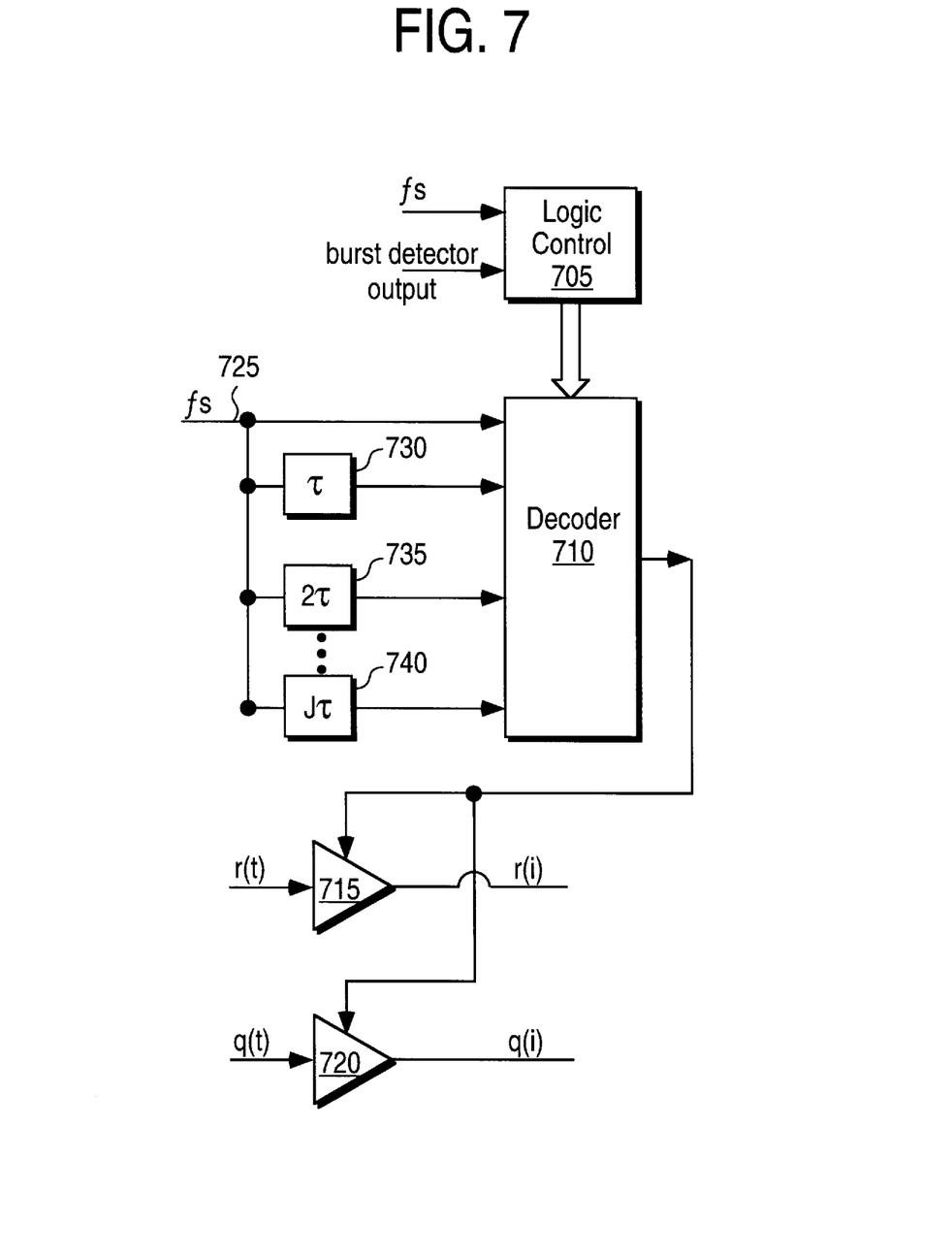
FIG. 7 is a block diagram illustration of circuitry to overcome ambiguity in phase measurement in accordance with the teachings of the present invention.

FIG. 7 illustrates an alternate embodiment for generating the real and complex sampled signals r(i) and q(i) that provides an elegant solution to this problem. Logic control 705 receives as input the sampling frequency $f_s$ to be used and the output of the burst detector (for those applications which process burst signals) and generates a control signal to decoder 710 to select the input signal to be output by decoder 710 (i.e., $f_s, f_s(\tau), f_s(2\tau) \ldots$) generated by inputs $f_s$ 725 and delays 730, 735, 740. The output of decoder 710 is used to control the timing of the samples of inputs r(t) and q(t) by ADCs 715, 720 to generate sampled signals r(i) and q(i). Thus, instead of sampling the different signal segments with the same sampling frequency, only the first segment is sampled using $f_s$. For the second segment, $f_s$ is shifted by $\tau$ and then used to sample the second segment. For the third segment, $f_s$ is delayed by 2 $\tau$ and so on. The time delay $\tau$ is chosen such that $f_s \tau$ is a number that is not rational. This ensures that the sampling pattern of each segment is different from the rest. With this scheme, the rms error of the final phase measurement converges to the actual phase rms error given by Cramer_Rao bound. It should be noted that many other schemes can be easily adapted to serve the same purpose. For example, instead of using different time delayed versions of the sampling frequency to provide different signal patterns, different sampling frequencies can be used to do the same function. Furthermore, for the applications where transit time is short for the cases where the number of samples in each segment is large, the sampling frequency for each segment can be modulated. A simple implementation of this scheme is achieved by phase modulating the positive going edge of the sampling frequency while preserving its negative going edge. This ensures phase modulating the sampling frequency without changing its frequency. This will overcome the ambiguity associated with each phase measurement.

The invention has been described in conjunction with the preferred embodiment. It is evident that numerous alternatives, modifications, variations and uses will be apparent to those skilled in the art in light of the foregoing description.

What is claimed is:

1. A method for measuring phase for N samples of a signal comprising the steps of:
   determining a number of K samples within an N sample;
   identifying a number of J segments within an N sample, each J segment composed of K samples;
   computing a frequency measurement of the signal for one of the J segments;
   computing a phase measurement of each J segment using the frequency computed for one of the J segments;
   combining the phase measurement of each J segment to generate a combined phase measurement indicative of the phase measurement of the N sample of the signal.

2. The method as set forth in claim 1, wherein the step of determining the number of K samples comprises the step of determining K based upon the signal to noise ratio (SNR) of the signal.

3. The method as set forth in claim 1, wherein the step of determining the number of K samples comprises the step of determining K such that rms in phase measurement at the minimum expected signal to noise ratio (SNR) of the signal is less than $\pi$.

4. The method as set forth in claim 1, wherein the step of identifying the number of J segments comprises determining J according to the following equation: J=N/K.

5. The method as set forth in claim 1, wherein the step of computing the frequency comprises the steps of:
dividing the J segment of the signal into a plurality of sampled signals, each sampled signal sampled at a different sampling frequency:
performing a discrete Fourier transform (DFT) on each sampled signal; and
combining the results of the DFT sampled signals to determine the frequency.

6. The method as set forth in claim 1, wherein the step of computing the frequency comprises using zero crossing counting.

7. The method as set forth in claim 1, wherein the step of computing the frequency comprises using a fast Fourier transform (FFT).

8. The method as set forth in claim 1, wherein the step of computing a phase measurement for each J segment comprises determining the phase measurement according to the following:

If $q_i=1$ then $\phi_i=\theta$
If $q_i=2$ then $\phi_i=\pi-\theta$
If $q_i=3$ then $\phi_i=\pi+\theta$
If $q_i=4$ then $\phi_i=2\pi-\theta$ where $q_i$ represents the quadrant of the phase measurement, and $\theta$ is determined according to the following:

$$\theta = \tan^{-1}\left\{\frac{\sum_{i=0}^{K}(r(i)\cos(2\pi i k_s/K) + q(i)\sin(2\pi i k_s/K))}{\sum_{i=0}^{K}(-r(i)\sin(2\pi i k_s/K) + q(i)\cos(2\pi i k_s/K))}\right\}$$

where $k_s$ is the estimated signal frequency normalized to the sampling frequency and $0 \leq \theta < \pi/2$.

9. The method as set forth in claim 1, wherein the step of combining the phase measurement of each J segment to generate a combined phase measurement comprises the steps of:
summing the phase measurement values of the J segments to generate a summed value $\Phi_{ACC}$;
determining the number of phase measurements that fall into each quadrant; and
determining the combined phase measurement according to the following;

If $q_1, q_2, \ldots, q_{J_{VAL}}$ = 1 or 2, then $\phi = \frac{\Phi_{ACC}}{J_{VAL}}$ If $q_1, q_2, \ldots, q_{J_{VAL}}$ = 2 or 3, then $\phi = \frac{\Phi_{ACC}}{J_{VAL}}$ If $q_1, q_2, \ldots, q_{J_{VAL}}$ = 3 or 4, then $\phi = \frac{\Phi_{ACC}}{J_{VAL}}$ If $q_1, q_2, \ldots, q_{J_{VAL}}$ = 1 or 4, then $\phi_t = \frac{\Phi_{ACC} - 2\pi q[4]}{J_{VAL}}$ ;

and

If $\phi_t \geq 0$ then $\phi = \phi_t$

If $\phi_t < 0$ then $\phi = 2\pi + \phi_t$ where $J_{VAL}$ represents the number of valid phase measurements, $q_1, q_2, \ldots q_{J_{VAL}}$ represent the quadrants of valid phase measurements, and $q[4]$ represents the number of valid phase measurements that falls into the fourth quadrant.

10. A method for measuring phase for N samples of a signal comprising the steps of:
computing a frequency measurement of the signal for one of J segments within an N sample, each J segment composed of K samples;
computing a phase measurement of each J segment using the frequency computed for one of the J segments;
combining the phase measurement of each J segment to generate a combined phase measurement indicative of the phase measurement of the N sample of the signal.

11. The method as set forth in claim 10, wherein the number of K samples is determined based upon the signal to noise ratio (SNR) of the signal.

12. The method as set forth in claim 10, wherein the step of computing the frequency comprises the steps of:
dividing the J segment of the signal into a plurality of sampled signals, each sampled signal sampled at a different sampling frequency:
performing a discrete Fourier transform (DFT) on each sampled signal; and
combining the results of the DFT sampled signals to determine the frequency.

13. The method as set forth in claim 10, wherein the step of computing the frequency comprises using zero crossing counting.

14. The method as set forth in claim 10, wherein the step of computing the frequency comprises using a fast Fourier transform (FFT).

15. The method as set forth in claim 10, wherein the step of computing a phase measurement for each J segment comprises determining the phase measurement according to the following:

If $q_i=1$ then $\phi_i=\theta$

If $q_i=2$ then $\phi_i=\pi-\theta$

If $q_i=3$ then $\phi_i=\pi+\theta$

If $q_i=4$ then $\phi_i=2\pi-\theta$ where $q_i$ represents the quadrant of the phase measurement, and $\theta$ is determined according to the following:

$$\theta = \tan^{-1}\left\{\frac{\sum_{i=0}^{K}(r(i)\cos(2\pi i k_s/K) + q(i)\sin(2\pi i k_s/K))}{\sum_{i=0}^{K}(-r(i)\sin(2\pi i k_s/K) + q(i)\cos(2\pi i k_s/K))}\right\}$$

where $k_s$ is the estimated signal frequency normalized to the sampling frequency and $0 \leq \theta < \pi/2$.

16. The method as set forth in claim 10, wherein the step of combining the phase measurement of each J segment to generate a combined phase measurement comprises the steps of:

summing the phase measurement values of the J segments to generate a summed value $\Phi_{ACC}$;

determining the number of phase measurements that fall into each quadrant; and determining the combined phase measurement according to the following;

If $q_1, q_2, \ldots, q_{J_{VAL}}$ = 1 or 2, then $\phi = \dfrac{\Phi_{ACC}}{J_{VAL}}$ If $q_1, q_2, \ldots, q_{J_{VAL}}$ = 2 or 3, then $\phi = \dfrac{\Phi_{ACC}}{J_{VAL}}$ If $q_1, q_2, \ldots, q_{J_{VAL}}$ = 3 or 4, then $\phi = \dfrac{\Phi_{ACC}}{J_{VAL}}$ If $q_1, q_2, \ldots, q_{J_{VAL}}$ = 1 or 4, then $\phi_t = \dfrac{\Phi_{ACC} - 2\pi q[4]}{J_{VAL}}$ ;

and

If $\phi_t \geq 0$ then $\phi = \phi_t$

If $\phi_t < 0$ then $\phi = 2\pi + \phi_t$ where JVAL represents the number of valid phase measurements, $q_1, q_2, \ldots q_{JVAL}$ represent the quadrants of valid phase measurements, and q[4] represents the number of valid phase measurements that falls into the fourth quadrant.

17. A circuit for measuring phase for N samples of a signal comprising:

at least one sampling circuit for sampling the signal;

a frequency measurement unit coupled to the at least one sampling circuit that computes a frequency measurement for one of J segments within an N sample, wherein each J segment is composed of K samples; and a phase measurement unit coupled to the at least one sampling circuit and the frequency measurement unit to compute a phase measurement of each J segment using the frequency computed for one of the J segments and to combine the phase measurement of each J segment to generate a combined phase measurement indicative of the phase measurement of the N sample of the signal.

18. The circuit as set forth in claim 17, further comprising a burst detector coupled to the output of the at least one sampling circuit and to the frequency measurement unit and phase measurement unit, said burst detector detecting the presence of the signal and enables the operation of the frequency measurement unit and phase measurement unit.

19. The circuit as set forth in claim 17, wherein the frequency measurement unit measures the frequency by dividing the J segment of the signal into a plurality of sampled signals, each sampled signal sampled at a different sampling frequency, performing a discrete Fourier transform (DFT) on each sampled signal, and combining the results of the DFT sampled signals to determine the frequency.

20. The circuit as set forth in claim 17, wherein the frequency measurement unit comprises a zero crossing counting circuit.

21. The circuit as set forth in claim 17, wherein the frequency measurement unit measures the frequency by using a fast Fourier transform (FFT).

22. The circuit as set forth in claim 17, wherein the phase measurement unit comprises:

circuitry to compute a phase measurement for each J segment according to the following:

If $q_i=1$ then $\phi_i=\theta$

If $q_i=2$ then $\phi_i=\pi-\theta$

If $q_i=3$ then $\phi_i=\pi+\theta$

If $q_i=4$ then $\phi_i=2\pi-\theta$ where $q_i$ represents the quadrant of the phase measurement, and $\theta$ is determined according to the following:

$$\theta = \tan^{-1}\left\{\dfrac{\sum_{i=0}^{K}(r(i)\cos(2\pi i k_s/K) + q(i)\sin(2\pi i k_s/K))}{\sum_{i=0}^{K}(-r(i)\sin(2\pi i k_s/K) + q(i)\cos(2\pi i k_s/K))}\right\}$$

where $k_s$ is the estimated signal frequency normalized to the sampling frequency and $0 \leq \theta < \pi/2$.

23. The circuit as set forth in claim 17, wherein the phase measurement unit comprises:

circuitry to combine the phase measurement of each J segment to generate the combined phase measurement according to the following:

an adder circuit to add the phase measurement values of the J segments to generate a summed value $\Phi_{ACC}$;

logic for determining the number of phase measurements that fall into each quadrant; and logic for determining the combined phase measurement according to the following;

If $q_1, q_2, \ldots, q_{J_{VAL}}$ = 1 or 2, then $\phi = \dfrac{\Phi_{ACC}}{J_{VAL}}$ If $q_1, q_2, \ldots, q_{J_{VAL}}$ = 2 or 3, then $\phi = \dfrac{\Phi_{ACC}}{J_{VAL}}$ If $q_1, q_2, \ldots, q_{J_{VAL}}$ = 3 or 4, then $\phi = \dfrac{\Phi_{ACC}}{J_{VAL}}$ If $q_1, q_2, \ldots, q_{J_{VAL}}$ = 1 or 4, then $\phi_t = \dfrac{\Phi_{ACC} - 2\pi q[4]}{J_{VAL}}$ ;

and

If $\phi_t \geq 0$ then $\phi = \phi_t$

If $\phi_t < 0$ then $\phi = 2\pi + \phi_t$ where JVAL represents the number of valid phase measurements, $q_1, q_2, \ldots q_{JVAL}$ represent the quadrants of valid phase measurements, and q[4] represents the number of valid phase measurements that falls into the fourth quadrant.

24. A circuit for measuring phase of N samples of a signal comprising the steps of:

at least one low resolution analog to digital converter (ADC) for sampling the signal;

a first logic computing a frequency measurement for one J segment of the sampled signal within an N sample, each J segment being composed of K samples;

a second logic for computing a phase measurement of each J segment using stored precomputed values; and a third logic for combining the phase measurements of each J segment to generate the phase measurement for N samples.

25. The circuit as set forth in claim 24, wherein the signal is sampled using 1-bit ADC.

26. The circuit as set forth in claim 24, wherein the frequency is measured using the Discrete Fourier Transform (DFT).

27. The circuit as set forth in claim 24, further comprising memory and at least one latch, wherein the sampled signal is temporarily stored in memory and then latched by that at least one latch.

28. The circuit as set forth in claim 24, further comprising look-up tables (LUTs) used to store the precomputed values of several samples of the input signal with the correspondent values of the reference signal.

29. The circuit as set forth in claim 28, wherein the input to the LUTs are the sampled signal stored in the latches, the frequency and the phase of the reference signal.

30. The circuit as set forth in claim 28, wherein accumulators are used to sum the LUT's outputs to produce values of x and y where, $$x = \sum_{i=0}^{K} [-r(i)\cos(2\pi i k_s/K) + q(i)\sin(2\pi i k_s/K)]$$

$$y = \sum_{i=0}^{K} [r(i)\sin(2\pi i k_s/K) + q(i)\cos(2\pi i k_s/K)]$$

where r(i) and q(i) represent sampled data, $k_s$ represents an estimated signal frequency normalized to the sampling frequency, and K represents the number of samples within a segment.

31. The circuit as set forth in claim 30, wherein the second logic computes the phase $\phi_j$ of a segment j by computing $\tan^{-1}$ (x/y) and the quadrant of the phase measurement.

32. The circuit as set forth in claim 31, wherein the third logic computes the phase measurement of N samples by combining the phase measurements $\phi_j$'s of valid segments.

33. A circuit for measuring phase over a large amplitude dynamic range comprising:

a plurality of sampling circuits for sampling the signal, each sampling circuit sampling different segments, each segment sampled at a sampling frequency fs;

a frequency measurement unit coupled to one sampling circuit of the plurality of sampling circuits;

a phase measurement unit to measure the phase of each segment and to combine the phase measurements to generate a phase measurement.

34. The circuit as set forth in claim 33, wherein at least one sampling circuit of the plurality of sampling circuits comprises a one bit analog to digital converter (ADC).

35. The circuit as set forth in claim 33, wherein each sampling circuit samples the signal for a segment using the sampling frequency of a previous segment delayed by τ, where τ is a time delay.

36. The circuit as set forth in claim 33, wherein a pattern of the sampled data at fs/4, where s represents the sampling frequency, for each segment is different than that of other segments sampled.

37. The circuit as set forth in claim 33, wherein the sampling frequency for each segment is phase modulated.

38. The circuit as set forth in claim 33, wherein the frequency of one segment is computed using Fourier analysis.

39. The circuit as set forth in claim 33, wherein the phase of each segment is computed using Fourier analysis method.

40. The circuit as set forth in claim 33, wherein the phase measurement of N samples of the input signal are computed by combining the phase measurements of valid segments of N samples.

* * * * *